US009867306B2

(12) United States Patent
Cheng (10) Patent No.: US 9,867,306 B2
(45) Date of Patent: Jan. 9, 2018

(54) ELECTRONIC DEVICE CAPABLE OF BEING FLEXIBLY CONFIGURED WITH MODULES OF DIFFERENT SPECIFICATIONS

(71) Applicant: TRUSTED SOLUTIONS CORPORATION, New Taipei (TW)

(72) Inventor: Kuang Hung Cheng, New Taipei (TW)

(73) Assignee: Trusted Solutions Corporation, New Taipei (TW)

( * ) Notice: Subject to any disclaimer, the term of this patent is extended or adjusted under 35 U.S.C. 154(b) by 0 days.

(21) Appl. No.: 15/130,009

(22) Filed: Apr. 15, 2016

(65) Prior Publication Data

US 2016/0309605 A1    Oct. 20, 2016

(30) Foreign Application Priority Data

Apr. 17, 2015  (TW) .............................. 104205886 U (51) Int. Cl.
*H05K 5/00* (2006.01)
*H05K 7/14* (2006.01)

(52) U.S. Cl.
CPC ......... *H05K 7/1435* (2013.01); *H05K 7/1418* (2013.01); *H05K 7/1425* (2013.01)

(58) Field of Classification Search
CPC ........................... H05K 7/1435; H05K 7/1425
USPC .................................................. 361/727, 756
See application file for complete search history.

(56) References Cited

U.S. PATENT DOCUMENTS

| 5,454,478 | A  | * | 10/1995 | Everson ............... | B65D 25/107 220/23.83 |
|---|---|---|---|---|---|
| 6,108,198 | A  | * | 8/2000 | Lin ......................... | G06F 1/181 312/223.1 |
| 6,201,708 | B1 | * | 3/2001 | Lewis ................. | G06F 13/4018 361/788 |
| 6,661,671 | B1 | * | 12/2003 | Franke .................... | G06F 1/189 361/679.02 |
| 6,975,510 | B1 | * | 12/2005 | Robbins ............. | H05K 7/20736 312/223.2 |
| 7,227,751 | B2 | * | 6/2007 | Robbins ............. | H05K 7/20736 312/223.1 |
| 7,455,375 | B2 |   | 11/2008 | Coffin et al. | |
| 7,499,286 | B2 | * | 3/2009 | Berke .................. | H05K 7/1487 361/727 |

(Continued)

*Primary Examiner* — Hung S Bui
(74) *Attorney, Agent, or Firm* — Muncy, Geissler, Olds & Lowe, P.C.

(57) ABSTRACT

An electronic device capable of being configured flexibly with modules of different specifications includes: a main body having a slot opening formed at the front of the main body and communicated with a slot space in the main body, slot rails disposed on at least one sidewall of the slot space of the main body and module slots communicated with the slot rails respectively; and a modular device, including electronic modules, each having at least one module rail slidably coupled to the slot rail. The module slots in the slot space are configured to be corresponsive to the module spaces respectively, and the module spaces serve as plug-in spaces for installing the electronic module and the module spaces are communicated with one another. The electronic device provides module application spaces for multifunctional applications and installing and applying modules of different specifications flexibly.

7 Claims, 5 Drawing Sheets

(56) References Cited

U.S. PATENT DOCUMENTS 8,289,696 B2 * 10/2012 Peng ............... G06F 1/187
　　　　　　　　　　　　　　　　　361/679.39

* cited by examiner

ELECTRONIC DEVICE CAPABLE OF BEING FLEXIBLY CONFIGURED WITH MODULES OF DIFFERENT SPECIFICATIONS

FIELD OF THE INVENTION

The present invention relates to an electronic device module structure, and more particularly to an electronic device capable of being configured flexibly with modules of different specifications and providing multifunctional flexible selective applications based on the assembly and application of modules of different specifications, so as to facilitate upgrades and improve cost-efficiency.

BACKGROUND OF THE INVENTION

Figure 1:
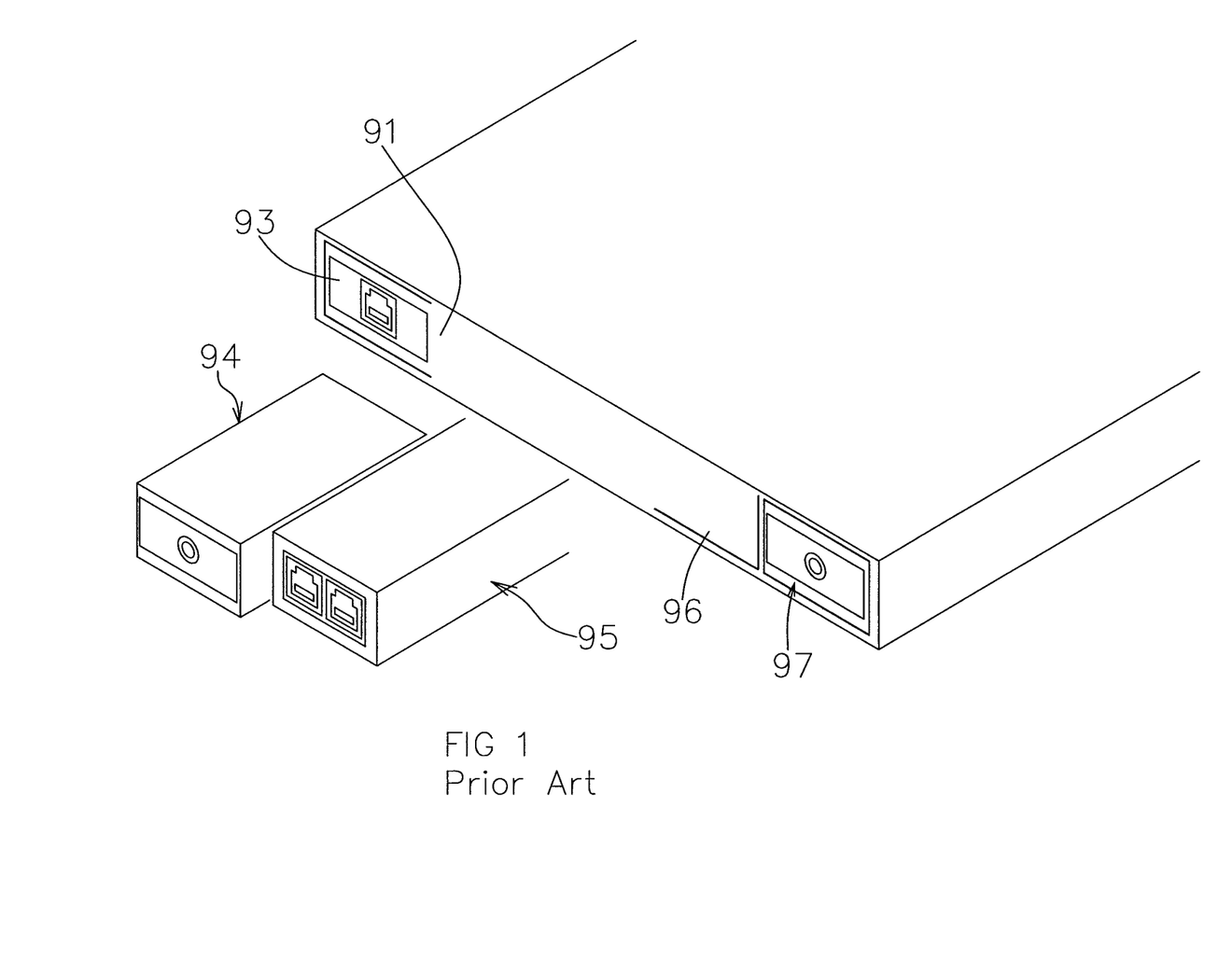
FIG. 1 is a schematic view of a conventional electronic device module structure.

Since the assembly and the application of an electronic device generally require module expansion or integration to meet the requirements for the convenience and cost-efficiency of the functional expansion or integration of the electronic device in the future, therefore an optimal modular design for various electronic devices is very important. For example, various present existing modular electronic devices include a hard disk module, a memory card module, an optical fiber network card module, a wireless local area network module, a Bluetooth module, a Zigbee module, a mobile communication module (LTE 4G, 4G), a cable communication module, an NFC module, a RFID module, a Z-wave module, an infrared module or any combination of the above. With reference to FIG. 1 for a conventional modular structure of an electronic device, the electronic device 90 comprises a plurality of device module spaces 92 partitioned and formed by a plurality of partition plates 91, and each electronic module 93-97 is installed into each respective device module space 92 to achieve the assembly and integration applications of various electronic modules (93-97).

Although the aforementioned modular structure of the conventional electronic device can achieve the application of combining and sharing different electronic information, yet the conventional structure still has the following drawback. For example, the device module spaces 92 of the electronic device 90 are accommodating spaces of a specific specification, and each corresponsive electronic module 93-97 also requires the corresponsive specification. In other words, specification and size of the electronic module 93-97 are fixed, so that when a certain electronic module (93-97) requires to be extended to (a greater or smaller) functional application, then it will require two or more electronic modules (93-97), and thus such design has a poor integration which is not cost-effective and definitely not a good design.

In view of the aforementioned drawbacks of the conventional electronic device module structure, the inventor of the present invention conducted extensive researches and experiments, and finally developed an electronic device capable of being configured flexibly with modules of different specifications, and such device is applicable for modules of different specifications flexibly, so as to facilitate upgrades and improve the cost-efficiency.

SUMMARY OF THE INVENTION

It is a primary objective of the present invention to provide an electronic device capable of being configured flexibly with modules of different specifications provides a plurality of module application spaces to provide a multiple of functions, and flexible assembly and application, so that manufacturers or users may selectively expend the application and installation as needed.

Another objective of the present invention is to provide an electronic device capable of being configured flexibly with modules of different specifications, and having the functions of expanding and applying the electronic device (such as a gateway) with Internet of Things (IoT) or any other network system, and the electronic device is applicable for the reserve contingency of changing and using different (IoT) systems, so as to improve the scope of applicability and advantage of the product.

To achieve the aforementioned and other objectives, the present invention provides an electronic device comprising: a main body, having a slot opening formed at a front end of the main body, a slot space communicated with the interior of the main body, a plurality of slot rails disposed on at least one sidewall of the slot space of the main body, a plurality of module slots communicated with the plurality of slot rails respectively, and the slot rail including at least one slot rail protrusion or a slot rail recession; and a modular device, including a plurality of electronic modules, each electronic module having at least one module rail slidably coupled to the slot rail, and each module rail including at least one module rail recession or a module rail protrusion; wherein the module slots in the slot space are configured to be corresponsive to the module spaces respectively, and the module spaces serve as a plug-in space of the electronic module, and the module spaces are communicated with one another.

Wherein, the slot rails are disposed on opposite upper and lower sidewalls or left and right sidewalls of the slot space respectively.

Wherein, the slot rail includes a combination of at least one slot rail protrusion and at least one slot rail recession, and the module rail includes a combination of at least one module rail recession and at least one module rail protrusion.

Wherein, the module slot has a slot edge disposed on both sides of the module slot separately and a slot connecting edge with twice of the distance is formed by two adjacent slot edges, and the electronic module has a module edge disposed on both sides of the electronic module separately.

Wherein, the module slot is a basic module slot assembly, and the modular device includes a plurality of electronic modules with different sizes and specifications and configured to be corresponsive to the module slot.

Wherein, the modular device further includes at least one extended electronic module having two basic module assemblies of different sizes and specifications.

Wherein, the electronic module has a module connection section formed by connecting edges of two adjacent modules and disposed at the middle of electronic module.

Wherein, the main body has a rear panel, a circuit board installed on the rear panel, a connector installed on the circuit board, and a connector installed at a rear end of the electronic module.

wherein the modular device includes a hard disk module, a memory card module, an optical fiber network card module, a wireless local area network module, a Bluetooth module, a Zigbee module, a mobile communication module (LTE 4G, 4G), a cable communication module, NFC module, RFID module, a Z-wave module, an infrared module, or any combination of the above.

The technical characteristics, contents, advantages and effects of the present invention will be apparent with the detailed description of a preferred embodiment accompanied with the illustration of related drawings as follows.

DESCRIPTION OF THE PREFERRED EMBODIMENTS

Figure 2:
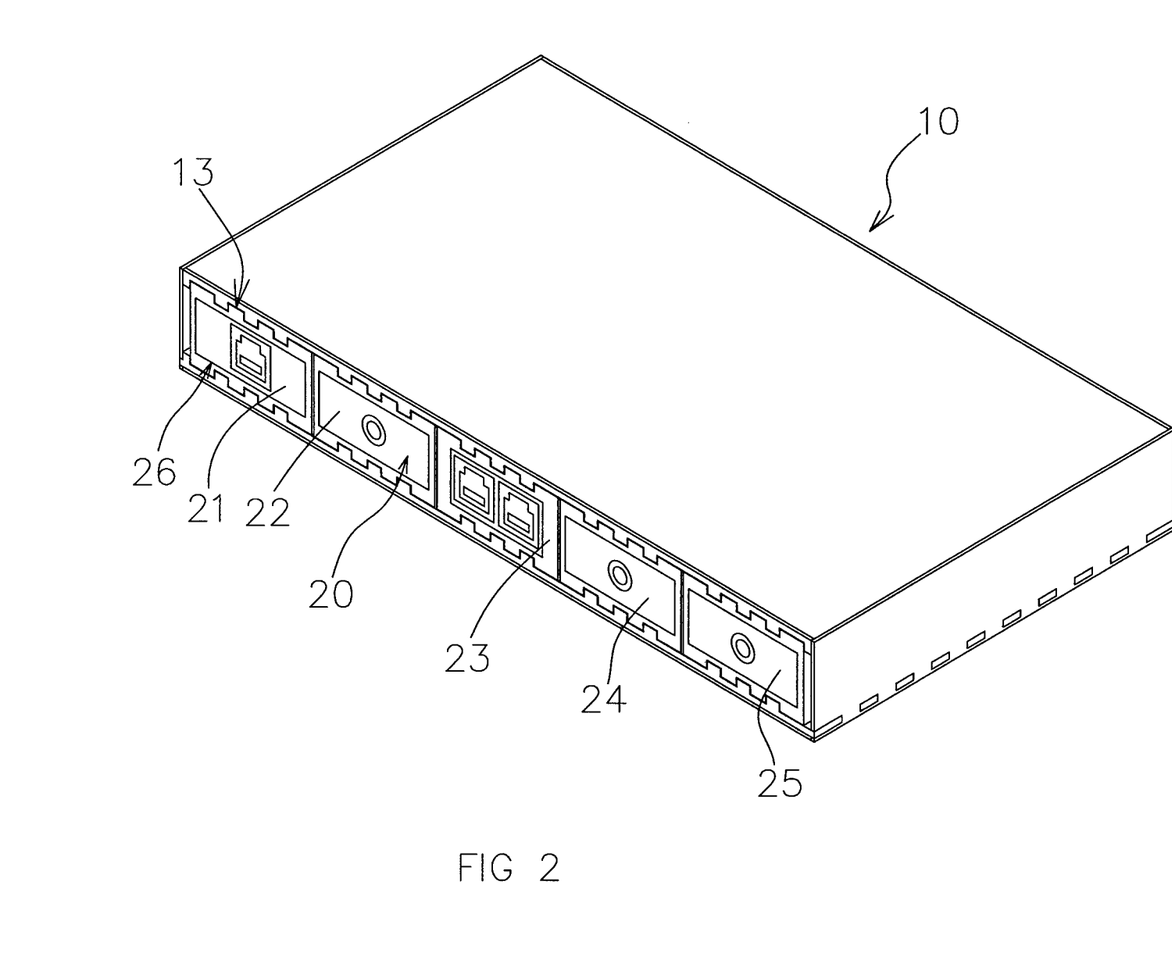
FIG. 2 is a perspective view of the present invention.
Figure 3:
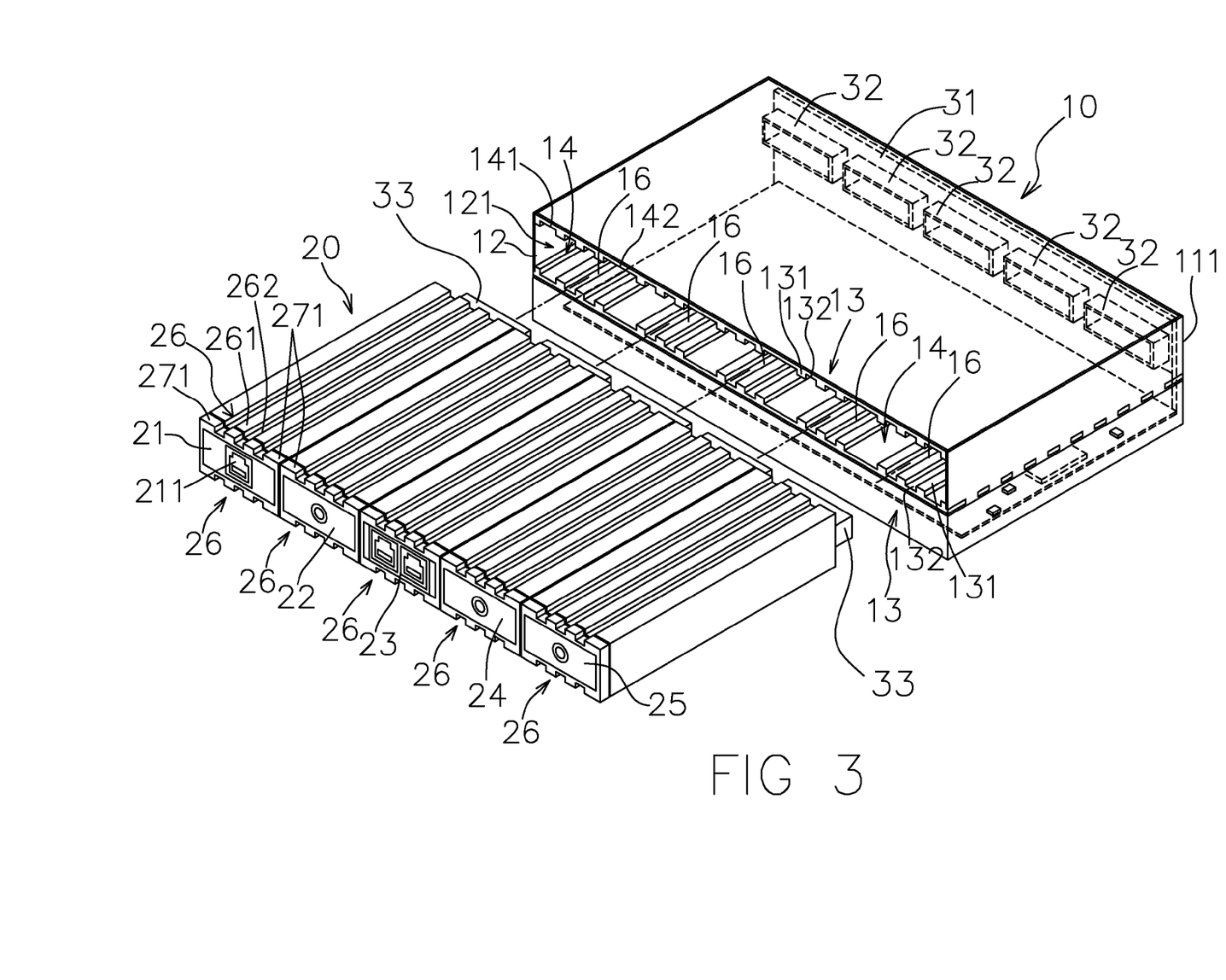
FIG. 3 is an exploded view of the present invention.
Figure 4:
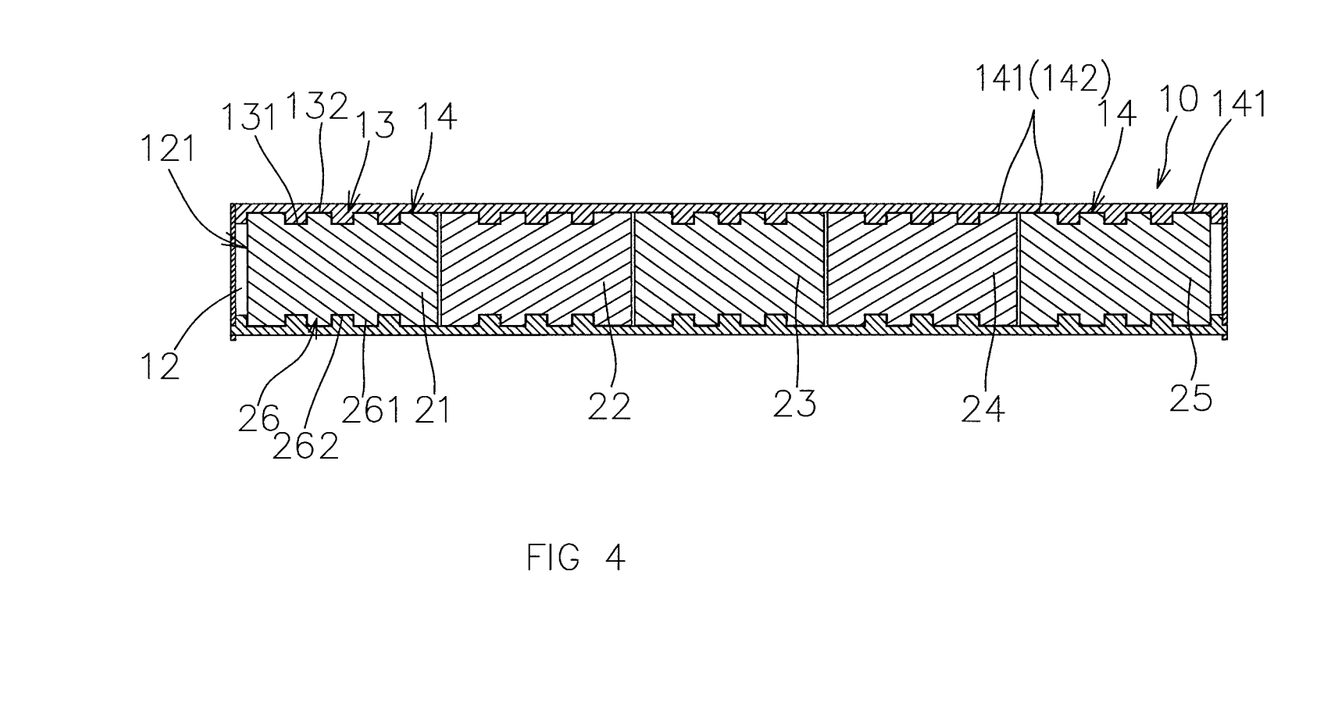
FIG. 4 is a cross-sectional view of the present invention.

With reference to FIGS. 2, 3 and 4 for an electronic device capable of being configured flexibly with modules of different specifications in accordance with the present invention, the electronic device comprises a main body 10 and a modular device 20. The main body 10 has a slot opening 12 formed at a front end (according to the direction of the figure, and the same applies to the following) of the main body 10 and communicated with a slot space 121 in the main body 10. The main body 10 has a slot rail 13 disposed on peripheral sidewalls of the slot space 121. In this embodiment, both upper sidewall and lower sidewall of the slot space 121 have a plurality of corresponsive slot rails 13, and the plurality of slot rails 13 form a plurality of module slots 14 respectively. In other words, one slot rail 13 forms a corresponsive module slot 14. In the figure, there are five module slots 14, and the module slot 14 is a basic module slot assembly, and the module slots 14 are situated at a communicating status. The slot rail 13 includes at least one slot rail protrusion 131, at least one slot rail recession 2, or a combination of the two. In other words, the slot rail 13 is an assembly of a slot rail protrusion 131, an assembly of a slot rail recession 2, or a combination of the two. In this embodiment, the slot rail 13 is a combination of a slot rail protrusion 131 and a slot rail recession 2. The module slot 14 has a slot edge 141 disposed on both sides of the module slot 14 separately, and a slot connecting edge 142 with twice of the distance formed by two adjacent slot edges 141. In addition, the main body 10 includes a circuit board 31 and a connector 32 installed therein, and the circuit board 31 and the connector 32 are generally installed on a rear panel 111 of the main body 10.

The slot rail 13 is installed on at least one sidewall such as an upper sidewall, a lower sidewall, a left sidewall or a right sidewall of the slot space 121. In a preferred embodiment, the slot rail 13 is preferably installed on two opposite sidewalls (such as upper and lower sidewalls or left and right sidewalls).

The modular device 20 includes a plurality of electronic modules which are modules with different functions. The modular device 20 includes but not limited to a hard disk module, a memory card module, an optical fiber network card module, a wireless local area network module, a Bluetooth module, a Zigbee module, a mobile communication module (LTE 4G, 4G), a cable communication module, an NFC module, a RFID module, a Z-wave module, an infrared module, or any combination of the above.

In this embodiment, the modular device 20 includes five electronic modules 21~25, and the quantity of electronic modules is equal to the quantity of the corresponsive module slots 14 of the main body 10, and the electronic modules 21~25 are basic module assemblies of different sizes and specifications and configured to be corresponsive the module slots 14 (basic module slot assemblies) respectively.

The module slots 14 have corresponsive module spaces 16 in the slot space 121 respectively, and the module spaces 16 serve as plug-in spaces of the electronic modules 21~25, and the module spaces 16 are communicated with one another.

Each of the electronic modules 21~25 has a module rail 26 slidably coupled to the slot rail 13, and the module rail 26 is an assembly including at least one module rail protrusion 261, at least one module rail recession 262, or a combination of the two. In other words, the module rail 26 is an assembly including a module rail protrusion 261, a module rail recession 262, or a combination of the two. In this embodiment, the slot rail 13 is an assembly including a combination of the module rail protrusion 261 and the module rail recession 262, wherein the module rail protrusion 261 is installed and coupled to the slot rail recession 2, and the module rail recession 262 is installed and coupled to the slot rail protrusion 131, so that the module rail 26 may be installed to the slot rail 13 or removed from the slot rail 13.

Wherein, the shape of the module rail protrusion 261 and the module rail recession 262 of the module rail 26, and the shape of the slot rail protrusion 131 and the slot rail recession 2 of the slot rail 13 are not limited specifically, as long as the shapes of the module rail protrusion 261 and the slot rail recession 2 are corresponsive to each other, or the shapes of the module rail recession 262 and the slot rail protrusion 131 are corresponsive to each other to achieve a stable sliding and plugging effect. If the module rail protrusion 261 is a rectangular protrusion, then the slot rail recession 2 may be a rectangular recession with the corresponsive shape. If the module rail protrusion 261 is an elliptical protrusion, then the slot rail recession 2 may be an elliptical recession with the corresponsive shape. In addition, the shapes of the module rail 26 and the slot rail 13 must be corresponsive to each other, so that the electronic device provides a foolproof function.

The electronic modules 21~25 of different functions have difference in some parts of the structure. For example, the electronic module 21 has a SFP connector 211 (wherein SFP stands for small form-factor pluggable transceiver, which is a small optical fiber transceiver), but the type and quantity of each the electronic module 21~25 are not limited specifically. In addition, a module edge 271 is disposed on both sides of the electronic module 21~25 separately, and a connector 33 is installed at a rear end of each of the electronic modules 21~25 for plugging in a connector 32 at the rear end of the module slot 14.

During the use of the electronic device capable of being configured flexibly with modules of different specifications in accordance with the present invention, the module rail 26 of each electronic module 21~25 is plugged and installed into the slot rail 13 of each module slot 14, so that the electronic modules 21~25 are plugged into the module slots 14 of the main body 10 for the installation, and the module edges 271 on both sides of each electronic module 21~25 are connected to the slot edges 141 on both sides of each module slot 14 respectively, and the connector 33 at the rear end of each electronic module 21~25 is connected to the connector 32 at the rear end of the corresponsive module slot 14.

Figure 5:
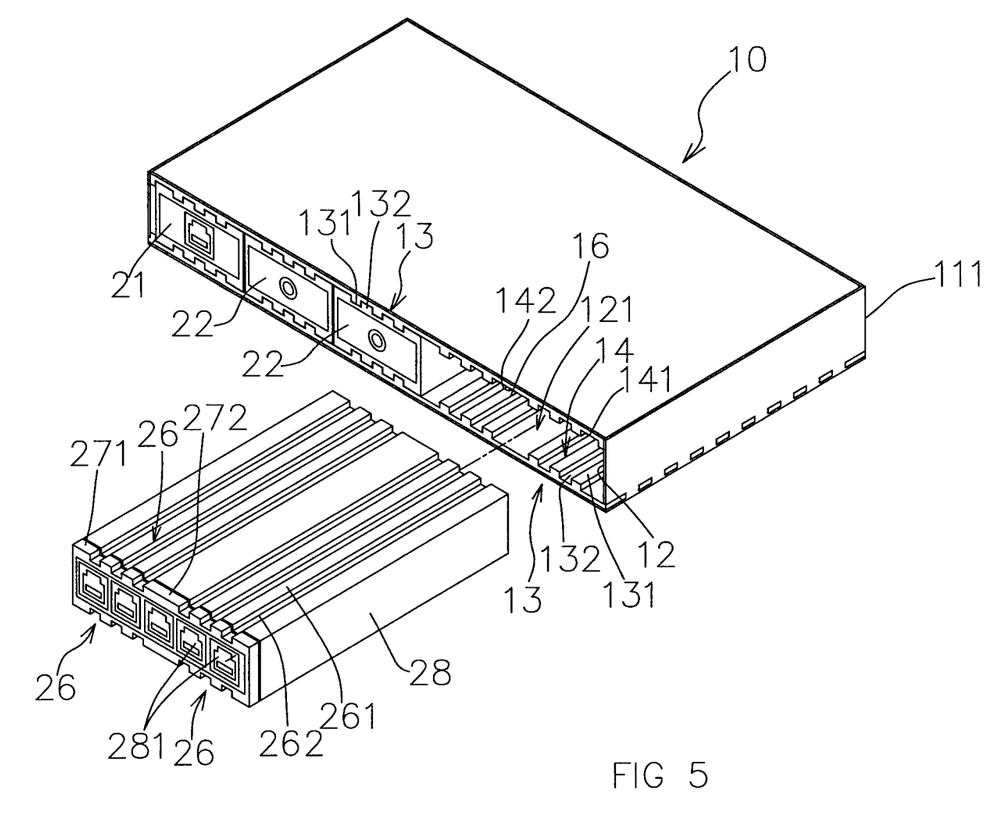
FIG. 5 is a schematic view of an extended application of the present invention.

With reference to FIG. 5 for an application of the electronic module 21~25 of a different specification, the structure of the electronic module 21~25 is modified, and the modification resides on that when the size and specification of the electronic module 21~25 are changed to expand its function, the electronic modules 21~25 with two or more basic module assemblies are combined and manufactured for the plugging and installing applications. In FIG. 5, the extended electronic module 28 has two basic module assemblies with different sizes and specifications, and the extended electronic module 28 has two module rails 26 (which are the same as the aforementioned module rails 26), and the middle of extended electronic module 28 has a module connection section 272 formed by connecting the two original two module edges 271. In other words, the module connection section 272 is formed by connecting the lengths of two module edges 271, and the front end of the extended electronic module 28 has a plurality of USB connectors 281 (or other connectors). In such architectural design, the module slots 14 of the main body 10 may be used for being plugged and used after the size and configuration of the electronic module is changed, so that the extended electronic module 28 is simply plugged into the two adjacent module slots 14 without requiring a change of configuration. In other words, the two module rails 26 of the extended electronic module 28 are configured to be corresponsive to the slot rails 13 of the two module slots 14 respectively, and the module connection section 272 of the extended electronic module 28 is connected to the two adjacent slot edges (which are the slot connecting edges 142) of the two module slots 14.

Therefore, the size and specification of the electronic module may be adjusted according to hardware requirements without requiring a change of the mechanism, and users may change the size of the module according to the total number of modules, and one module space 16 may be used for plugging one electronic module, or an electronic module may occupy a greater width, and such flexible configuration improves the diversity of the application, and the uniform specification of the module improves the convenience and simplifies the procedures of replacement and maintenance, so as to provide a flexible application and improve the cost-efficiency.

The electronic module may be configured with different sizes and specifications to provide different types of electronic modules including communication modules of different protocols, so that the electronic device of the present invention may be used as an electronic device of IoT. Different communication modules of different IoT network systems may be included, so that the present invention may be applicable for present and future IoT systems.

The electronic device capable of being configured flexibly with modules of different specifications in accordance with the present invention provides a plurality of module application spaces for flexibly installing and applying multifunctional modules of different specifications, so that to meet the manufacturers or users requirement for expansion and operation and achieve the effects of excellent application flexibility and cost-efficiency. In the meantime, the electronic device is applicable for the reserve contingency of changing and using different (IoT) systems, so as to improve the scope of applicability and advantage of the product.

In summation of the description above, the present invention is a major breakthrough of the prior art and complies with patent application requirements, and is thus duly filed for patent application. While the invention has been described by means of specific embodiments, numerous modifications and variations could be made thereto by those skilled in the art without departing from the scope and spirit of the invention set forth in the claims.

What is claimed is:

1. An electronic device capable of being configured flexibly with modules of different specifications, comprising:
   a main body, having a slot opening formed at a front end of the main body, a slot space communicated with the interior of the main body, a plurality of slot rails disposed on at least one sidewall of the slot space of the main body, a plurality of module slots communicated with the plurality of slot rails respectively, and the slot rail including at least one slot rail protrusion or a slot rail recession; and
   a modular device, including a plurality of electronic modules, each electronic module having at least one module rail slidably coupled to the slot rail, and each module rail including at least one module rail recession or a module rail protrusion;
   wherein the module slots in the slot space are configured to be corresponsive to the module spaces respectively, and the module spaces serve as a plug-in space of the electronic module, and the module spaces are communicated with one another;
   wherein the main body has a rear panel a circuit board installed on the rear panel a first connector installed on the circuit board, and a second connector installed at a rear end of the electronic module; and
   wherein the module slot has a slot edge disposed on both sides of the module slot separately and a slot connecting edge with twice of the distance is formed by two adjacent slot edges, and the electronic module has a module edge disposed on both sides of the electronic module separately.

2. The electronic device capable of being configured flexibly with modules of different specifications according to claim 1, wherein the slot rails are disposed on opposite upper and lower sidewalls or left and right sidewalls of the slot space respectively.

3. The electronic device capable of being configured flexibly with modules of different specifications according to claim 1, wherein the slot rail includes a combination of at least one slot rail protrusion and at least one slot rail recession, and the module rail includes a combination of at least one module rail recession and at least one module rail protrusion.

4. The electronic device capable of being configured flexibly with modules of different specifications according to claim 1, wherein the module slot is a basic module slot assembly, and the modular device includes a plurality of electronic modules with different sizes and specifications and configured to be corresponsive to the module slot.

5. The electronic device capable of being configured flexibly with modules of different specifications according to claim 4, wherein the modular device further includes at least one extended electronic module having two basic module assemblies of different sizes and specifications.

6. The electronic device capable of being configured flexibly with modules of different specifications according to claim 5, wherein the electronic module has a module connection section formed by connecting edges of two adjacent modules and disposed at the middle of electronic module.

7. The electronic device capable of being configured flexibly with modules of different specifications according to claim 1, wherein the modular device includes a hard disk module, a memory card module, an optical fiber network card module, a wireless local area network module, a Bluetooth module, a Zigbee module, a mobile communication module (LTE 4G, 4G), a cable communication module, NFC module, RFID module, a Z-wave module, an infrared module, or any combination thereof.

* * * * *